(12) United States Patent  
Brabec et al.

(10) Patent No.: US 7,196,834 B2
(45) Date of Patent: Mar. 27, 2007

(54) TRANSPARENT FLAT BODY

(75) Inventors: Christoph Brabec, Linz (AT); Erhard Glöetzl, Linz (AT); Franz Padinger, St. Florian (AT); Niyazi Serdar Sariciftci, Linz (AT)

(73) Assignee: Konarka Austria Forschungs-und Entwicklungs GmbH, Linz (AT)

( * ) Notice: Subject to any disclaimer, the term of this patent is extended or adjusted under 35 U.S.C. 154(b) by 0 days.

(21) Appl. No.: 10/486,116

(22) PCT Filed: May 31, 2002

(86) PCT No.: PCT/AT02/00166

§ 371 (c)(1),
(2), (4) Date: Jul. 13, 2004

(87) PCT Pub. No.: WO03/015189

PCT Pub. Date: Feb. 20, 2003

(65) Prior Publication Data

US 2004/0233502 A1 Nov. 25, 2004

(30) Foreign Application Priority Data

Aug. 7, 2001 (AT) .............................. A 1231/2001

(51) Int. Cl.
*G02F 1/03* (2006.01)
*G02F 1/15* (2006.01)
*G02F 1/153* (2006.01)
*H01L 31/00* (2006.01)
*H01L 31/042* (2006.01)

(52) U.S. Cl. .................. 359/245; 359/246; 359/265; 359/275; 136/263; 136/247; 136/250; 136/254; 136/256; 136/257; 136/259; 438/80

(58) Field of Classification Search ................ 359/245, 359/246, 265, 275, 254; 136/250, 259, 246, 136/253, 254, 247, 257, 256, 263; 257/40, 257/184, E51.013; 438/80
See application file for complete search history.

(56) References Cited

U.S. PATENT DOCUMENTS 3,902,920 A * 9/1975 Jordan et al. ................ 136/258

(Continued)

OTHER PUBLICATIONS

Bechinger, C. et al., "Development of a new self-powered electrochromic device for light modulation without external power supply," *Solar Energy Materials and Solar Cells*, 54, pp. 405-410, 1998.

(Continued)

*Primary Examiner*—Loha Ben
(74) *Attorney, Agent, or Firm*—Fish & Richardson P.C.

(57) ABSTRACT

This invention relates to a transparent flat body including two transparent cover layers (1, 2) that confine between them an active layer (3) whose transparency varies in an electric field and disposed between two electrode layers (6, 7) optionally subdivided into sections, and a photovoltaic element that is connected to two electrode layers (6, 8), preferably via a control stage (11), and that includes a photoactive layer (4) between the two electrode layers (6, 8) of the photovoltaic element (5), characterized in that the photoactive layer (4) is made of two transparent molecular components in a manner known per se, one of the two electrode layers (6, 7) of the active layer (3) is simultaneously one of the two electrode layers (6, 8) of the photovoltaic element (5), and the two transparent cover layers (1, 2) confine between them both the photovoltaic element (5) and the active layer (3).

20 Claims, 1 Drawing Sheet

U.S. PATENT DOCUMENTS

| | | | | |
|---|---|---|---|---|
| 4,051,465 | A | * | 9/1977 | Brody .................... 365/117 |
| 4,095,217 | A | * | 6/1978 | Tani et al. ................ 345/87 |
| 4,127,738 | A | * | 11/1978 | Ghosh et al. ............. 136/255 |
| 4,281,208 | A | * | 7/1981 | Kuwano et al. ........... 136/249 |
| 4,629,821 | A | * | 12/1986 | Bronstein-Bonte et al. . 136/257 |
| 4,808,242 | A | * | 2/1989 | Murata et al. ............. 136/244 |
| 4,872,925 | A | * | 10/1989 | McMaster ................. 136/244 |
| 5,377,037 | A | * | 12/1994 | Branz et al. ............... 359/265 |
| 5,385,615 | A | * | 1/1995 | Horne ..................... 136/246 |
| 5,670,791 | A | * | 9/1997 | Halls et al. ............... 257/40 |
| 6,150,605 | A | * | 11/2000 | Han ........................ 136/263 |
| 6,297,495 | B1 | * | 10/2001 | Bulovic et al. ........... 250/214.1 |
| 6,340,789 | B1 | * | 1/2002 | Petritsch et al. ........... 136/263 |
| 6,352,777 | B1 | * | 3/2002 | Bulovic et al. ........... 428/411.1 |
| 6,459,035 | B2 | * | 10/2002 | Ziegler et al. ............. 136/257 |
| 2004/0067324 | A1 | * | 4/2004 | Lazarev et al. ............ 428/1.31 |

OTHER PUBLICATIONS

Benson, David, et al., "Design goals and challenges for a photovoltaic-powered electrochromic window covering," *Solar Energy Materials and Solar Cells*, 39, pp. 203-211, 1995.

Gao, Wei et al., "Approaches for large-area a-SiC:H photovoltaic-powered electrochromic window coatings," *Journal of Non-Crystalline Solids*, 266-269, pp. 1140-1144, 2000.

Mastragostino, M. et al., "Polymer-based electrochromic devices," *Solid State Ionics*, 53-56, pp. 471-478, 1992.

* cited by examiner

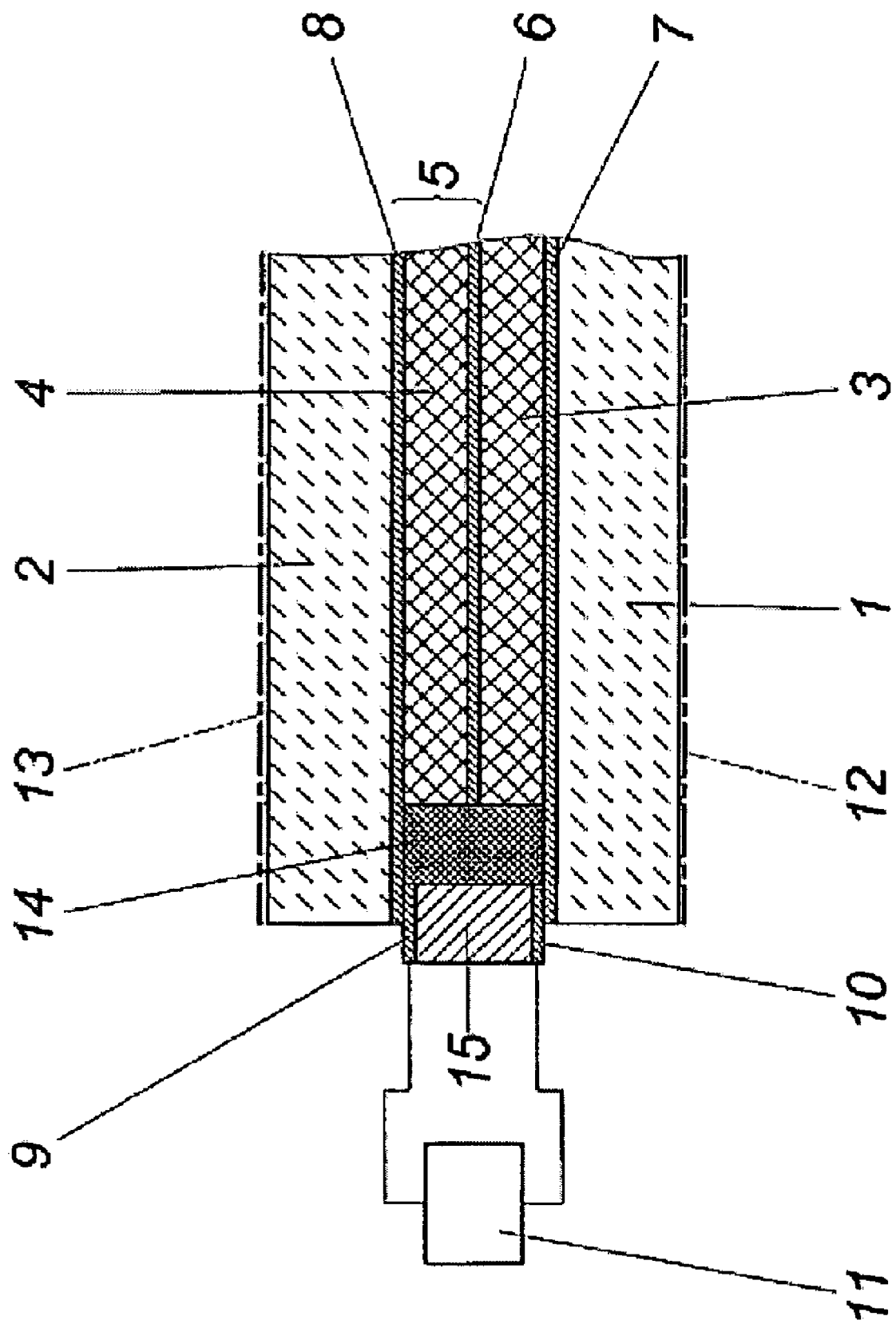

TRANSPARENT FLAT BODY

This application claims priority under 35 U.S.C. §371 to a national phase filing of international application number PCT/AT02/00166, filed May 31, 2002, which claims priority to AT 1231/2001, filed Aug. 7, 2001. These applications are incorporated by reference herein.

TECHNICAL FIELD

The invention relates to a transparent flat body comprising two transparent cover layers that confine between them an active layer disposed between first and second electrode layers, which are optionally divided into portions, the transparency of said active layer varying in an electric field, and a photovoltaic element that is connected to first and second electrode layers, preferably via a control stage, and that comprises a photoactive layer disposed between first and second electrode layers.

PRIOR ART

Transparent flat bodies of the kind constituted by liquid crystal displays or by window layers of controllable transparency comprise an active layer whose transparency varies in an electric field and which is disposed between two electrode layers, optionally divided into portions, through which the electric field necessary for controlling the active layer is at least portionally applied. In the case of liquid crystals, the substantially plane-parallel liquid crystal molecules form twisted nematic cells; when an electric field is applied, the liquid crystal molecules twist in the direction of that field, and after the voltage is interrupted they revert from their field-oriented state to the twisted structure. Through the use of polarization filters on both cover layers of the active layer, the field-oriented state can be made visible by the absorption of light. In contrast, electrochromic active layers are based on the interaction of two colorless or only faintly colored substances, one oxidizable and the other reducible: under the influence of an electric voltage, the one is reduced and the other oxidized, at least one of these substances being colored. After the voltage is interrupted the two original redox substances re-form, undergoing decolorization or a lightening of color in the process. Since the electrical energies necessary for generating the electric field used to control the transparency of the active layer are comparatively low regardless of the structure of the active layer, photovoltaic elements are a logical choice as power supplies, especially since their sensitivity to light permits simple, independent control of the transparency of the active layer. A disadvantage of the photovoltaic elements used heretofore is that they must have a sufficiently large light-absorbing surface area if they are to provide the necessary supply of energy. The amount of space needed for this purpose increases with decreasing efficiency. This is true in particular of photovoltaic elements whose photoactive layer is not made, in conventional fashion, of silicon, but rather of conjugated synthetic substances containing sequences of alternating single and double bonds. In terms of electron energy, this results in energy bands comparable to those of semiconductors, and these materials can therefore be converted from a nonconductive state to a metallically conductive one by doping. To improve the efficiency of energy conversion by photovoltaic polymer cells made of a conjugated polymer, it is known (U.S. Pat. No. 5,670,791 A) to fabricate the photoactive layer out of two molecular components, specifically a conjugated polymer component as electron donor and a filler as electron acceptor. This makes it possible to avoid the otherwise standard combination of charge carriers, which does bring about a sizable increase in efficiency, but still leaves it well below that of silicon-based photovoltaic elements.

DESCRIPTION OF THE INVENTION

The object of the invention, therefore, is to supply a transparent flat body of the species set forth at the beginning hereof with the energy necessary to control the active layer via a photovoltaic element, and to do so with comparatively low fabrication expenditure and without the need to provide additional space for the arrangement of the photovoltaic element.

The invention achieves this object in that the photoactive layer of the photovoltaic element is made of two transparent molecular components in a manner known per se, one of the two electrode layers of the active layer is simultaneously one of the electrode layers of the photovoltaic element, and the two transparent cover layers confine between them both the photovoltaic element and the active layer.

Due to the use of a photovoltaic element comprising a photoactive layer made of two transparent molecular components as electron donor and electron acceptor, the transparent flat body can itself serve as the substrate for the photovoltaic element, thus allowing said photovoltaic element to extend over the entire surface of the transparent flat body. As a result, enough electrical energy to control the active layer of the transparent flat body can be made available even when the energy conversion efficiency is relatively low. The relatively large area of the photovoltaic element notwithstanding, the fabrication expenditure is still low, since one of the two electrode layers of the active layer of the transparent flat body is used as the electrode for the photovoltaic element, whose photoactive layer is therefore fabricated on the one electrode layer of the transparent flat body. Not only does this render superfluous any transparent cover layers between the active layer of the transparent flat body and the photoactive layer of the photovoltaic element, it also eliminates the considerable expenditure of making a separate electrode layer for the photovoltaic element on the side facing the active layer of the transparent flat body. Both the active layer of the transparent flat body and the photoactive layer of the photovoltaic element are confined between two common, transparent cover layers, which in turn enables the transparent flat body and the photovoltaic element to be sealed in common.

Since the supply of energy to the flat body of controllable transparency must be guaranteed regardless of the degree of transparency selected, it is advisable to dispose the photovoltaic element on a side of the active layer confronting a light source.

BRIEF DESCRIPTION OF THE DRAWING

The subject matter of the invention is illustrated in exemplary fashion in the drawing, which specifically is a schematic cross section of a transparent flat body according to the invention.

BEST WAY TO IMPLEMENT THE INVENTION

In the exemplary embodiment illustrated, the transparent flat body comprises two transparent cover layers 1, 2 of glass or synthetic material, confining between them both an active layer 3 for controlling transparency, and a photoactive layer 4 of a photovoltaic element 5. Active layer 3 can be fabricated in the usual manner as an electrochromic layer, which, disposed between two adjacent electrode layers 6 and 7, can be exposed to an electric field by means of which the transparency of said active layer 3 is controlled. These electrode layers 6 and 7 are preferably made of an indium tin oxide (ITO), although, in contrast to conventional flat bodies of controllable transparency, particularly window layers, here only one of the two electrode layers 6, 7 is deposited on a transparent cover layer 1. This is because the electrode layer 6 facing away from cover layer 1 is simultaneously an electrode layer for photovoltaic element 5, whose other electrode layer 8 is assigned to cover layer 2. Photoactive layer 4 of photovoltaic element 5, which can be fabricated in multiple layers, is made of a conjugated polymer as electron donor and a filler as electron acceptor. Whereas hole-collecting electrode layer 6 is made of a transparent, conductive oxide, electron-collecting electrode layer 8 of photovoltaic element 5 can be made of aluminum, which is applied to photoactive layer 4 by vapor deposition. Owing to the small layer thickness, this metal electrode layer 8 is also transparent.

When the conjugated polymer is excited by irradiated light, electrons are given up to the filler of photoactive layer 4, resulting in a corresponding build-up of voltage. Since electrode layer 8 is electrically connected via an electric contact 9 to electric contact 10 of electrode layer 7 of active layer 3, the voltage build-up in photoactive layer 4 produces an electric field between electrode layers 6 and 7 (since electrode layer 6 is shared) that controls the chemical reaction of the redox substances of active layer 3 and thus their color behavior. To influence this control, a suitable control stage 11 can be wired into the electric connection of the two electric contacts 9 and 10.

If active layer 3 is not made of electrochromic substances but is instead fabricated on the basis of liquid crystals, this does alter the mode of operation of active layer 3, but not the fact of its being driven via photovoltaic element 5. However, cover layers 1 and 2 must be provided with corresponding polarization layers 12 and 13, as shown in dashed and dotted lines in the drawing, in order to use the orientation of the liquid crystal molecules in the direction of the electric field to shade the transparent flat body.

Although the transparent flat body is depicted as a window layer in the drawing, the invention is not limited to this embodiment, but can also be used in connection with a liquid crystal display. To this end, electrode layer 7 must be suitably divided and the portions driven separately from one another, so that the resultant driving of individual liquid-crystal cells among those forming active layer 3, which are arranged in a matrix pattern, will produce a display.

Combining an active layer 3 to control transparency with a photovoltaic element 5 to supply energy for controlling the active layer 3 into a common, transparent flat body yields a simplicity of construction that is made feasible by the use in common of an electrode layer 6 between active layer 3 and photoactive layer 4, as well as transparent cover layers 1 and 2 for both layers 3 and 4. Moreover, the two layers 3 and 4 can be sealed in common, since only the gap on the edge between cover layers 1 and 2 must be sealed with a seal 14. The mutual spacing of cover layers 1 and 2 can be maintained via spacers 15, preferably bearing electric contacts 9 and 10.

The invention claimed is:

1. A transparent flat body comprising two transparent cover layers that confine between them an active layer disposed between first and second electrode layers, the transparency of the active layer varying in an electric field, and a photovoltaic element that is connected to the first electrode layer and a third electrode layer, the photovoltaic element comprising a photoactive layer between the first and third electrode layers, wherein the photoactive layer is made of two transparent molecular components, and the two transparent cover layers confine between them both the photovoltaic element and the active layer.

2. The transparent flat body as recited in claim 1, characterized in that said photovoltaic element is arranged on a side of said active layer confronting a light source.

3. The transparent body of claim 1, wherein the first and second electrode layers are optionally subdivided into sections.

4. The transparent body of claim 1, wherein the photovoltaic element is connected to the first and third second electrode layers via a control stage.

5. An article, comprising:
   a first transparent layer;
   a second transparent layer;
   a first electrode between the first and second transparent layers;
   a second electrode between the first electrode and the first transparent layer;
   a third electrode between the first electrode and the second transparent layer;
   a photoactive layer between the first and third electrodes; and
   an active layer between the first and second electrodes, the active layer having a first transparency in a first electric field and a second transparency in a second electric field, the first transparency being different from the second transparency, and the first electric field being different from the second electric field,
   wherein the first and third electrodes are in electrical communication.

6. The article of claim 5, wherein the article includes a photovoltaic cell that comprises the first electrode, the third electrode and the photoactive layer.

7. The article of claim 6, wherein the active layer comprises an electochromic substance.

8. The article of claim 6, wherein the active layer comprises a liquid crystal material.

9. The article of claim 8, further comprising:
   a first polarization layer; and
   a second polarization layer,
   wherein the first transparent layer is between the first polarization layer and the second electrode, and the second transparent layer is between the second polarization layer and the third electrode.

10. The article of claim 5, wherein the active layer comprises a liquid crystal material.

11. The article of claim 5, wherein the active layer comprises an electrochromic substance.

12. The article of claim 11, further comprising:
   a first polarization layer; and
   a second polarization layer,
   wherein the first transparent layer is between the first polarization layer and the second electrode, and the second transparent layer is between the second polarization layer and the third electrode.

13. The article of claim 5, further comprising:
   a first polarization layer; and
   a second polarization layer,
   wherein the first transparent layer is between the first polarization layer and the second electrode, and the second transparent layer is between the second polarization layer and the third electrode.

14. The article of claim 13, wherein the photoactive layer comprises an electron donor and an electron acceptor.

15. The article of claim 14, wherein the electron donor comprises a conjugated polymer and the electron acceptor comprises a fullerene.

16. The article of claim 5, further comprising a control stage that electrically connects the first and second electrodes.

17. The article of claim 5, wherein the photoactive layer comprises an electron donor and an electron acceptor.

18. The article of claim 17, wherein the electron donor comprises a conjugated polymer.

19. The article of claim 18, wherein the electron acceptor comprises a fullerene.

20. The article of claim 17, wherein the electron acceptor comprises a fullerene.

* * * * *